(12) United States Patent
Ning et al.

(10) Patent No.: US 9,196,746 B2
(45) Date of Patent: Nov. 24, 2015

(54) THIN FILM TRANSISTOR COMPRISING MAIN ACTIVE LAYER AND SUB ACTIVE LAYER, AND METHOD OF MANUFACTURING THE SAME

(75) Inventors: Hong-Long Ning, Suwon-si (KR);
Byeong-Beom Kim, Suwon-si (KR);
Chang-Oh Jeong, Suwon-si (KR);
Sang-Won Shin, Yongin-si (KR);
Hyeong-Suk Yoo, Yongin-si (KR);
Xin-Xing Li, Suwon-si (KR);
Joon-Yong Park, Gunpo-si (KR);
Hyun-Ju Kang, Pocheon-si (KR);
Su-Kyoung Yang, Chuncheon-si (KR);
Kyung-Seop Kim, Incheon (KR)

(73) Assignee: SAMSUNG DISPLAY CO., LTD. (KR)

( * ) Notice: Subject to any disclaimer, the term of this patent is extended or adjusted under 35 U.S.C. 154(b) by 182 days.

(21) Appl. No.: 13/487,409

(22) Filed: Jun. 4, 2012

(65) Prior Publication Data
US 2012/0286272 A1    Nov. 15, 2012

(30) Foreign Application Priority Data
Dec. 5, 2011    (KR) .................. 10-2011-0129148

(51) Int. Cl.
*H01L 29/10*    (2006.01)
*H01L 29/786*   (2006.01)

(52) U.S. Cl.
CPC ...... *H01L 29/78693* (2013.01); *H01L 29/7869* (2013.01); *H01L 29/78696* (2013.01)

(58) Field of Classification Search
CPC ............... H01L 29/7869; H01L 29/78693; H01L 29/78696
USPC ........... 257/43, E29.117, E29.137, E29.151, 257/E29.202, E29.273, E29.276, 57
See application file for complete search history.

(56) References Cited

U.S. PATENT DOCUMENTS

| 5,767,007 A | 6/1998 | Uchibori et al. |
| 5,846,855 A * | 12/1998 | Igarashi et al. ............... 438/158 |
| 2008/0296568 A1* | 12/2008 | Ryu et al. ........................ 257/43 |
| 2010/0012945 A1 | 1/2010 | Zheng et al. |

FOREIGN PATENT DOCUMENTS

| JP | 05283429 A | 10/1993 |
| KR | 1020110058076 A | 6/2011 |

* cited by examiner

*Primary Examiner* — Jay C Kim
(74) *Attorney, Agent, or Firm* — Cantor Colburn LLP

(57) ABSTRACT

A thin film transistor includes a gate electrode on a substrate, a main active layer in electrical connection with the gate electrode and including an exposed channel portion, a source electrode in electrical connection with the main active layer, a drain electrode which is spaced apart from the source electrode and in electrical connection with the main active layer, and a sub active layer in electrical connection to the main active layer.

6 Claims, 28 Drawing Sheets

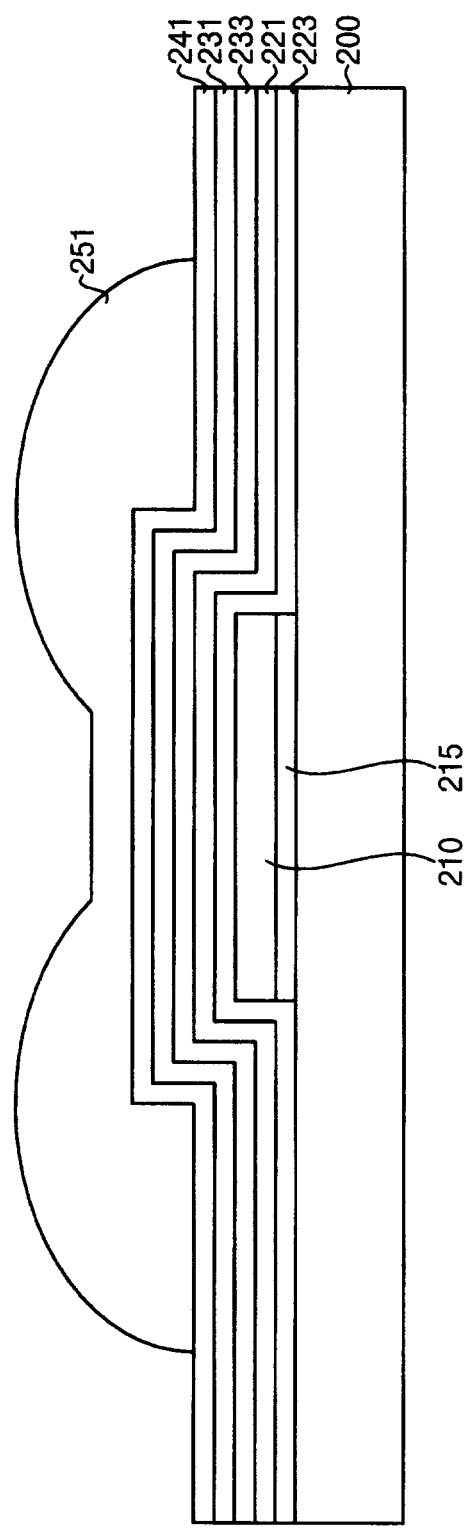

THIN FILM TRANSISTOR COMPRISING MAIN ACTIVE LAYER AND SUB ACTIVE LAYER, AND METHOD OF MANUFACTURING THE SAME

This application claims priority to Korean Patent Application No. 10-2011-0129148, filed on Dec. 5, 2011, and all the benefits accruing therefrom under 35 U.S.C. §119, the contents of which are herein incorporated by reference in its entirety.

BACKGROUND OF THE INVENTION

1. Field of the Invention

Exemplary embodiments of the invention relate to a thin film transistor and a method of manufacturing the thin film transistor. More particularly, exemplary embodiments of the invention relate to a thin film transistor and a method of manufacturing the thin film transistor which improves electron mobility.

2. Description of the Related Art

As a liquid crystal display ("LCD") apparatus has been developed, a size of the LCD apparatus has increased, while a desire to have higher resolution and to have faster response time has remained. The improvement in performance of the LCD apparatus depends largely on further development of the manufacturing process and the selection of appropriate materials thereof. Various active layer materials have been used, for example, micro-crystal silicon, zinc oxide or laser radicalization technology amorphous silicon. However, these active layer materials have disadvantages such as instability, low deposition rate, non-uniformity and so on. These active layer materials have not completely replaced the traditional amorphous silicon active layer to date. However, an amorphous indium gallium zinc oxide ("InGaZnO") as an active layer material has potential for use in high resolution televisions and three-dimensional ("3D") televisions employing liquid crystal display technology.

BRIEF SUMMARY OF THE INVENTION

Exemplary embodiments of the invention provide a thin film transistor with improved electron mobility and formed without annealing process.

Exemplary embodiments of the invention also provide a manufacturing process of the thin film transistor with improved electron mobility and formed without annealing process.

According to an exemplary embodiment of the invention, a thin film transistor includes a gate electrode on a substrate, a main active layer in electrical connection with the gate electrode and including a channel portion which is exposed, a source electrode in electrical connection with the main active layer, a drain electrode which is spaced apart from the source electrode and in electrical connection with the main active layer, and a sub active layer in electrical connection with the main active layer.

In an exemplary embodiment, the sub active layer may include a lower sub active layer between the main active layer and the gate electrode.

In an exemplary embodiment, the thin film transistor may further include a channel protective layer on the channel portion of the main active layer.

In an exemplary embodiment, the thin film transistor may further include a capping layer between the main active layer and the source electrode, and between the main layer and the drain electrode.

In an exemplary embodiment, the sub active layer may include an upper sub active layer on the channel portion of the main active layer, and in electrical connection with the source electrode and the drain electrode.

In an exemplary embodiment, an upper surface of the upper sub active layer is substantially coplanar with upper surfaces of the source electrode and the drain electrode.

In an exemplary embodiment, an upper surface of the upper sub active layer may be lower than upper surfaces of the source electrode and the drain electrode.

In an exemplary embodiment, the sub active layer may further include a lower sub active layer between the main active layer and the gate electrode.

In an exemplary embodiment, the thin film transistor may further include a capping layer between the main active layer and the source electrode, and between the man active layer and the drain electrode.

According to another exemplary embodiment of the invention, a method for manufacturing a thin film transistor includes forming a gate metallic layer on a substrate, forming a sub active layer on the gate metallic layer, forming a main active layer on the sub active layer, forming a source/drain metallic layer on the main active layer, exposing a channel portion by etching the source/drain metallic layer, forming a source/drain insulation layer on the sub active layer and on the source/drain metallic layer, and forming a pixel electrode layer on the source/drain insulation layer.

In an exemplary embodiment, after the exposing the channel portion, the method for manufacturing may further include forming a channel protective layer on the exposed channel portion.

In an exemplary embodiment, the channel protective layer may be formed by a sputtering process.

In an exemplary embodiment, a thickness of the sub active layer may be about 150 angstroms (Å) and about 500 Å.

In an exemplary embodiment, the sub active layer may be formed by a sputtering process.

According to another exemplary embodiment of the invention, a method for manufacturing a thin film transistor includes forming a gate metallic layer on a substrate, forming a main active layer on the gate metallic layer, forming a source/drain metallic layer on the main active layer, exposing a channel portion by etching the source/drain metallic layer, forming a sub active layer electrically connected to the source/drain metallic layer, forming a source/drain insulation layer on the sub active layer and on the source/drain metallic layer, and forming a pixel electrode layer on the source/drain insulation layer.

In an exemplary embodiment, after the forming the gate metallic layer, the method for manufacturing may further include forming a lower sub active layer on the gate metallic layer.

In an exemplary embodiment, an upper surface of the sub active layer may be substantially coplanar with an upper surface of the source/drain metallic layer.

In an exemplary embodiment, after the forming the main active layer, the method for manufacturing may further include forming a capping layer between the main active layer and the source/drain metallic layer.

In an exemplary embodiment, an upper surface of the sub active layer may be lower than an upper surface of the source/drain metallic layer, and higher than an upper surface of the capping layer.

In an exemplary embodiment, the sub active layer includes substantially the same material as the main active layer.

According to one or more embodiments of the invention, a sub active layer increases electron mobility of an active layer of a thin film transistor, and is formed without an annealing process during manufacturing of the thin film transistor. Thus, without additional annealing process, the electron mobility is increased in the thin film transistor, and manufacturing time and costs are decreased. Moreover, the sub active layer does not need a further mask process, further decreasing manufacturing time and costs.

In addition, a channel protective layer or an upper sub active layer is formed on the main active layer and protects the main active layer in a chemical vapor deposition process. Thus, the performance of the finally formed thin film transistor is not degraded.

In addition, the upper sub active layer provides an additional electrical path at a channel portion of the thin film transistor, and helps self-cure the main active layer. Thus, the performance of the finally formed thin film transistor is improved.

BRIEF DESCRIPTION OF THE DRAWINGS

The above and other features of the invention will become more apparent by describing in detail exemplary embodiments thereof with reference to the accompanying drawings, in which:

FIG. 5A to FIG. 5M are cross-sectional views illustrating another exemplary embodiment of a manufacturing method in accordance with the invention.

DETAILED DESCRIPTION OF THE INVENTION

Figure 1:
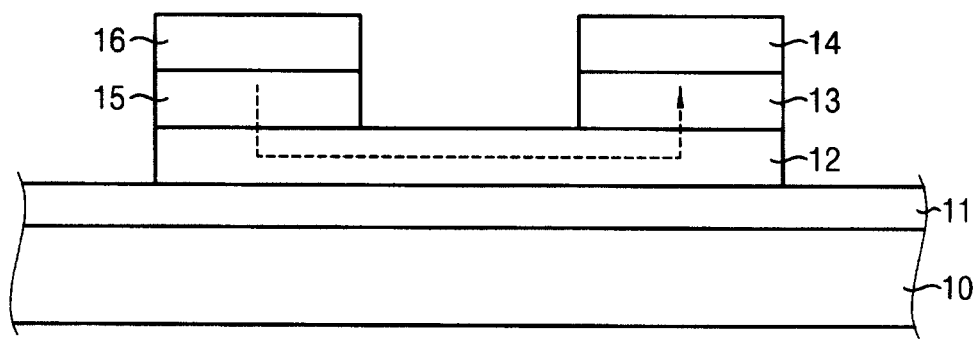
FIG. 1 is a cross-sectional view illustrating a conventional thin film transistor.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" or "under" relative to other elements or features would then be oriented "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be explained in detail with reference to the accompanying drawings.

A conventional thin film transistor ("TFT") including an amorphous oxide semiconductor active material may be formed using six masks in a manufacturing process, which undesirably increases costs of the manufacturing process. Alternatively, the conventional amorphous TFT liquid crystal display ("LCD") manufacturing process may use four masks. However, when the amorphous TFT LCD is formed using four masks, a channel portion of the TFT may be back etched and result in damage from a later passivation chemical vapor deposition ("CVD") process.

FIG. 1 is a cross-sectional view of a conventional TFT. Referring to FIG. 1, the conventional TFT structure includes a substrate 10, a gate metallic layer 11, an active layer 12, a capping layer 13 and 15, a drain electrode layer 14 and a source electrode layer 16. When electrical voltage is applied to the gate metallic layer 11, the active layer 12 is activated, so that the electrical current flows from the source electrode layer 16 to the drain electrode layer 14. The electrical path from the source electrode layer 16 to the drain electrode layer 14 includes only the active layer 12, as illustrated by the dotted line. Thus, a limited amount of electrical current flows through the conventional TFT structure.

Figure 2:
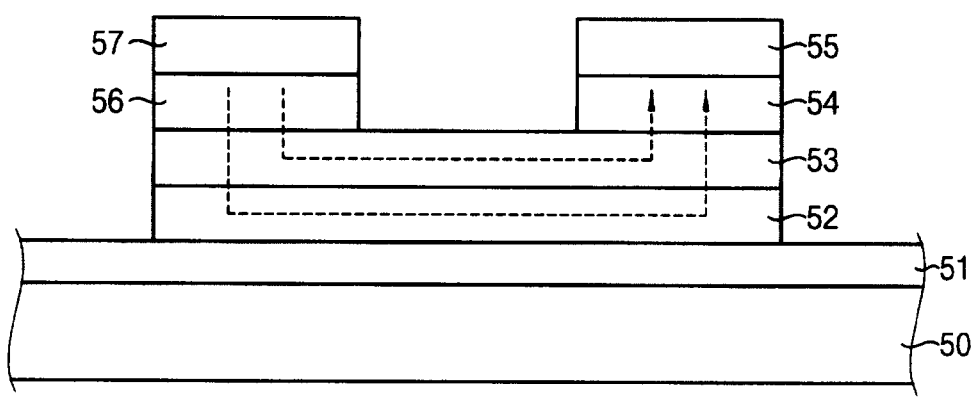
FIG. 2 is a cross-sectional view illustrating an exemplary embodiment of a thin film transistor in accordance the invention.

FIG. 2 is a cross-sectional view illustrating an exemplary embodiment of a TFT in accordance with the invention.

Referring to FIG. 2, the TFT includes a substrate 50, a gate electrode 51, a sub active layer 52, a main active layer 53, a capping layer 54 and 56, a drain electrode 55 and a source electrode 57. The main active layer may collectively include layer 53 and the capping layer 54 and 56. Different from the conventional TFT structure in FIG. 1, the exemplary embodiment of the TFT further includes the sub active layer 52 between the gate electrode 51 and the main active layer 53.

The gate electrode 51 is directly on the substrate 50. The main active layer 53 includes a channel portion which is electrically connected with the gate electrode 51 and exposed. The source electrode 57 is electrically connected to the main active layer 53. The drain electrode 55 is spaced apart from the source electrode 57 and is electrically connected to the main active layer 53. The channel portion is an exposed portion of the main active layer 53 excluding the source electrode 57 and the drain electrode 53 thereon. The sub active layer 52 is electrically connected to the main active layer 53. The sub active layer 52 is between the main active layer 53 and the gate electrode 51.

When electrical voltage is applied to the gate electrode 51, electrical current flows in a first path through the source electrode 57, the capping layer 56, the main active layer 53 the capping layer 54 and the drain electrode 55 in order, as illustrated by the upper dotted line. In addition, the electrical current flows in a second path through the source electrode 57, the capping layer 56, the main active layer 53, the sub active layer 52, the main active layer 53, the capping layer 54 and the drain electrode 55 in order, as illustrated by the lower dotted line.

The sub active layer 52 provides an additional electrical path when electrical current flows through the TFT. The sub active layer 52 also reduces the electrical resistance such that there are more electrical current carriers for electron mobility. The electron mobility is improved by the sub active layer 52 without an annealing process when the TFT is formed.

A channel protective layer (not shown) may be further on the main active layer 53. The channel protective layer will be described later with respect to an embodiment of a manufacturing method for the TFT.

Figure 3A:
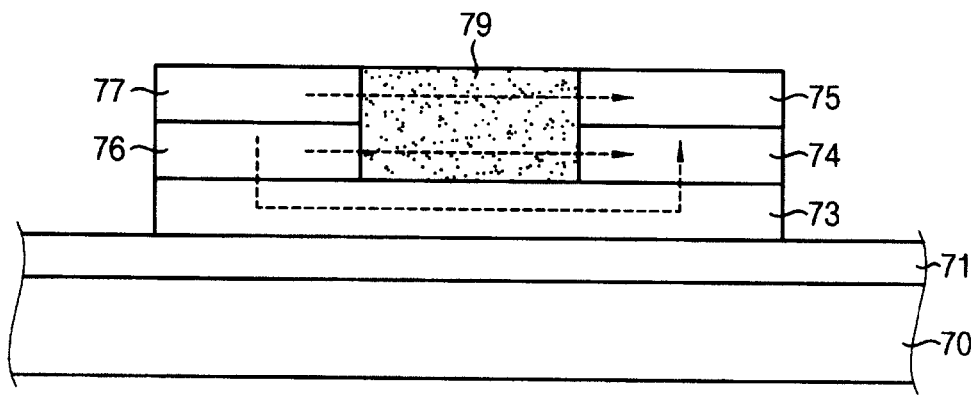
FIG. 3A and FIG. 3B are cross-sectional views illustrating other exemplary embodiments of a thin film transistor in accordance with the invention.
Figure 3B:
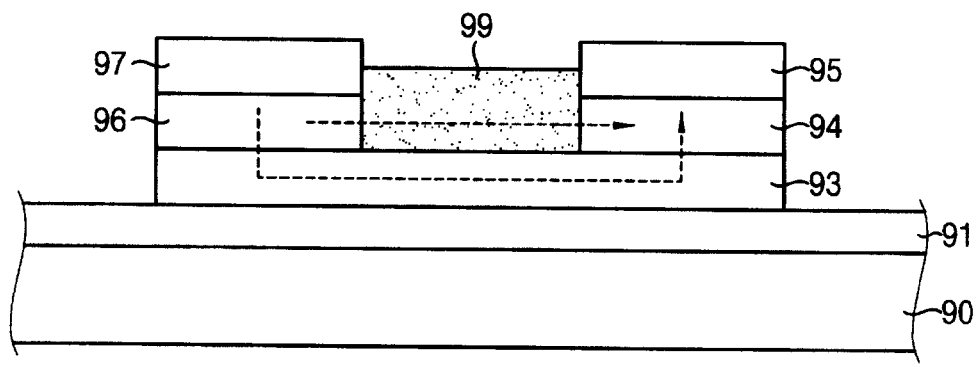

FIG. 3A and FIG. 3B are cross-sectional views illustrating other exemplary embodiments of a TFT in accordance with the invention.

Referring to FIG. 3A, the exemplary embodiment of a TFT includes a substrate 70, a gate electrode 71, a main active layer 73, a capping layer 74 and 76, a drain electrode 75, a source electrode 77 and a sub active layer 79. Different from the conventional TFT structure, the sub active layer 79 is further on the main active layer 73. An upper surface of the sub active layer 79 is substantially coplanar with an upper surface of the source electrode 77 and/or the drain electrode 75.

The gate electrode 71 is directly on the substrate 70. The main active layer 73 is electrically connected to the gate electrode 71 and includes a channel portion which is exposed. The source electrode 77 is electrically connected to the main active layer 73. The drain electrode 75 is spaced apart from the source electrode 77 and is electrically connected to the main active layer 73. The channel portion is an exposed portion of the main active layer 73 excluding the source electrode 77 and the drain electrode thereon. The sub active layer 72 is electrically connected to the main active layer 73. The sub active layer 72 is directly on the channel portion of the main active layer 73.

When the electrical voltage is applied to the gate electrode 71, electrical current flows in a first path through the source electrode 77, the capping layer 76, the main active layer 73, the capping layer 74 and the drain electrode 75 in order, as illustrated by the lowest dotted line. In addition, the electrical current flows in a second path through the source electrode 77, the sub active layer 79 and the drain electrode 75 in order, as illustrated by the uppermost dotted line. In addition, the electrical current flows in a third path through the source electrode 77, the capping layer 76, the sub active layer 79, the capping layer 74 and the drain electrode 75 in order as illustrated by the middle dotted line.

Referring to FIG. 3B, an alternative exemplary embodiment of the TFT includes a substrate 90, a gate electrode 91, a main active layer 93, capping layers 94 and 96, a drain electrode 95, a source electrode 97 and a sub active layer 99. In FIG. 3B, an upper surface of the sub active layer 99 is not coplanar with an upper surface of the source electrode 97 and the drain electrode 95. In detail, the upper surface of the sub active layer 99 is lower than the upper surfaces of the source electrode 97 and the drain electrode 95.

The gate electrode 91 is directly on the substrate 90. The main active layer 93 is electrically connected to the gate electrode 91 and includes a channel portion which is exposed. The source electrode 99 is electrically connected to the main active layer 93. The drain electrode 99 is spaced apart from the source electrode 99 and electrically connected to the main active layer 93. The channel portion is an exposed portion of the main active layer 93 excluding the source electrode 99 and the drain electrode 93 thereon. The sub active layer 92 is electrically connected to the main active layer 93. The sub active layer 92 is directly on the channel portion of the main active layer 93.

When the electrical voltage is applied to the gate electrode 91, the electrical current flows in a first path through the source electrode 97, the capping layer 96, the main active layer 93, the capping layer 94 and the drain electrode 95 in order, as illustrated by the lower dotted line. In addition, the electrical current flows in a second path through the source electrode 97, the capping layer 96, the sub active layer 99, the capping layer 94 and the drain electrode 95 in order, as illustrated by the upper dotted line.

The sub active layer 79 and 99 provides an additional electrical path when the electrical current flows through the TFT. The sub active layer 79 and 99 also reduces the electrical resistance such that there are more electrical current carriers for electron mobility, by the sub active layer 79 and 99. The electron mobility is improved by the sub active layer 79 and 99 without an annealing process when the TFT is formed.

A lower sub active layer (not shown) may be further under the main active layer 93, between the main active layer 93 and the gate electrode 91. The lower sub active layer will be described later with respect to an embodiment of a manufacturing method for the TFT.

FIG. 4A to FIG. 4M are cross-sectional views illustrating an exemplary embodiment of a manufacturing method in accordance with the invention.

In the exemplary embodiment, a manufacturing method using another material, such as an indium zinc tin oxide ("InZnTO", or an indium zinc oxide "XIZO"), or an amorphous indium gallium zinc oxide, ("InGaZnO"), will be applied. The XIZO is an oxide comprising indium, zinc, and an additional element, wherein the additional element is Sn, Ga, Al, Be, Mg, Ca, Sr, Ba, Ra, Tl, Sc, Y, La, Ac, Ti, Zr, Hf, or Rf, or a combination thereof. Representative oxides include $Ga_2O_3In_2O_3ZnO$ and $HfO_2In_2O_3ZnO$. In the exemplary embodiment, a conventional amorphous TFT process including a four mask process is used.

Figure 4A:
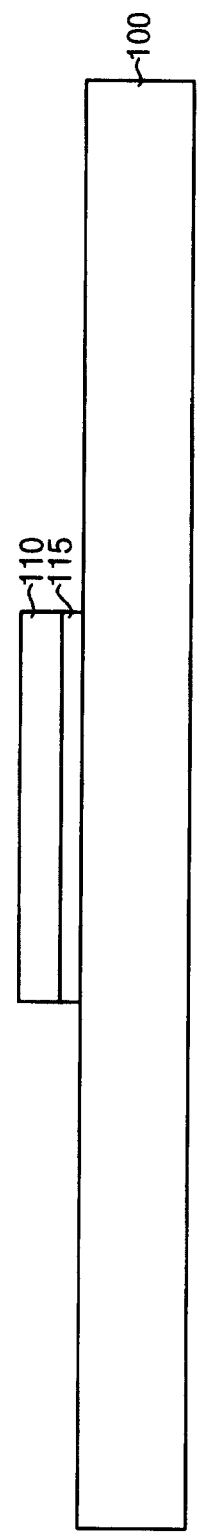
FIG. 4A to FIG. 4M are cross-sectional views illustrating an exemplary embodiment of a manufacturing method in accordance with the invention.

Referring to FIG. 4A, a gate metallic layer 110 is deposited on a substrate 100. The gate metallic layer 110 may include aluminum, copper, chrome and so on. Under the gate metallic layer 110, an additional insulation layer 115 may be formed when required. A gate electrode or a gate wiring may be formed by patterning the gate metallic layer 110. In order to pattern the gate metallic layer 110, a conventional photoresist process, a wet etching process and/or a stripping process may be used.

Figure 4B:
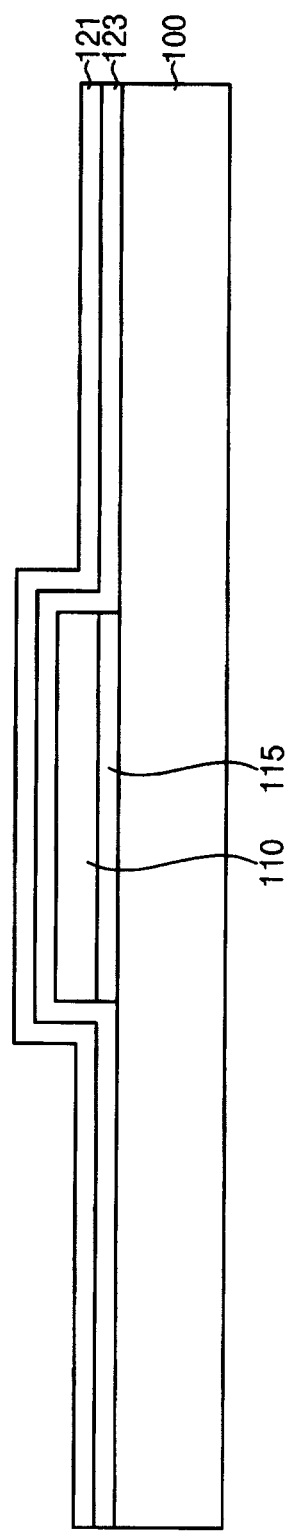

Referring to FIG. 4B, a gate insulation layer 123 is deposited on the gate metallic layer 110 and the exposed substrate 100. The gate insulation layer 123 may include a silicon nitride, or a silicon oxide, for example. A lower sub active layer 121 is deposited on the gate insulation layer 123. The lower sub active layer 121 may be deposited by a sputtering process. A thickness of the lower sub active layer 121 may be between about 150 angstroms (Å) and about 500 Å, specifically about 200 Å to about 400 Å. The lower sub active layer 121 may include a gallium zinc oxide in which a content of zinc may be about 50 mole % to about 99.9 mole %, specifically about 60 mole % to about 99 mole %, more specifically about 70 mole % to about 98 mole %, and a content of gallium may independently be about 0.1 mole % to about 25 mole %, specifically about 1 mole % to about 20 mole %, more specifically about 2 mole % to about 15 mole %, based on a total moles of zinc and gallium. An embodiment in which the gallium zinc oxide comprises 95.4 mole % zinc and 4.6 mole % gallium, each based on a total moles of zinc and gallium, is specifically mentioned.

Table 1 shows electron mobility ("Mob") in centimeters squared per volt-second (cm2/V·s) of the main active layer (an amorphous indium gallium zinc oxide, "aInGaZnO") having a thickness of 500 Å, when the lower sub active layer 121 (a gallium zinc oxide, "GaZnO") including Ga and Zn is formed in various thicknesses without using an annealing process to manufacture the TFT. Impulse or momentum in newton-seconds (N·s) per $cm^2$ and force in newtons (N) per cubed centimeter ($cm^3$) are also shown.

TABLE 1

| Sample (no annealing) | Mob (cm2/V · s) | N · s (/cm²) | N (/cm³) |
|---|---|---|---|
| aInGaZnO 500 Å | 0 | 0 | 0 |
| GaZnO 100 Å + aInGaZnO 500 Å | 0 | 0 | 0 |
| GaZnO 200 Å + aInGaZnO 500 Å | 6.27 | −3.96E+14 | −7.91E+19 |
| GaZnO 300 Å + aInGaZnO 500 Å | 8.15 | −5.90E+14 | −1.18E+20 |

As shown in Table 1, when the thickness of the lower sub active layer 121 is about or under 100 Å, the electron mobility of the main active layer of the TFT is not improved effectively. Moreover, when the thickness of the lower sub active layer 121 is too large, there may be a serious undercut problem in a later active wet etch process.

Figure 4C:
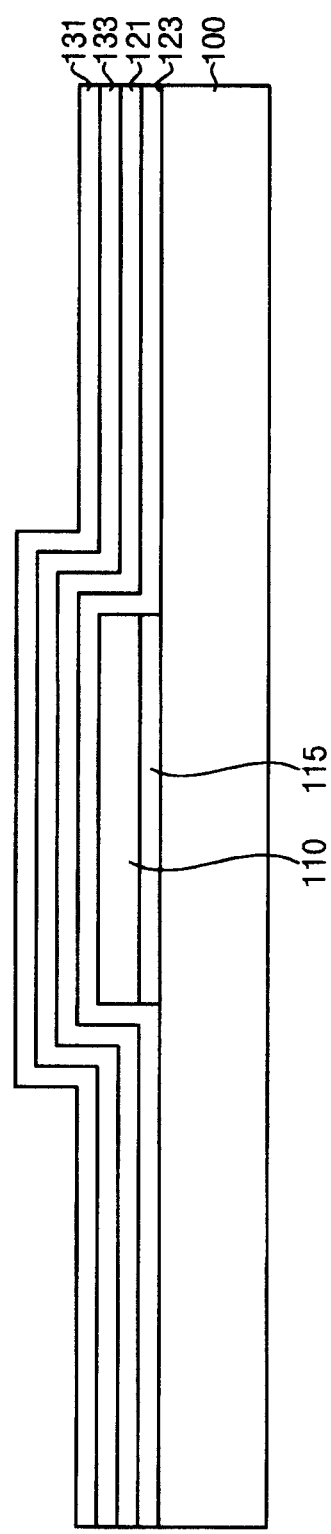

Referring to FIG. 4C, a main active layer 133 is deposited on the lower sub active layer 121. The main active layer 133 includes amorphous silicon. In exemplary embodiments, the main active layer 133 may include an amorphous gallium indium zinc oxide, or an indium zinc oxide, (e.g., "aInGaZnO", "InZnTO", "XIZO"), for example. The XIZO is an oxide of indium, zinc, and an additional element, wherein the additional element is Sn, Ga, Al, Be, Mg, Ca, Sr, Ba, Ra, Tl, Sc, Y, La, Ac, Ti, Zr, Hf, or Rf, or a combination thereof. The main active layer may collectively include layer 133 and a capping layer 131. The capping layer 131 is formed before a source/drain metallic layer, may be adhesive and may form as a buffer layer for the source/drain metallic layer.

Figure 4D:
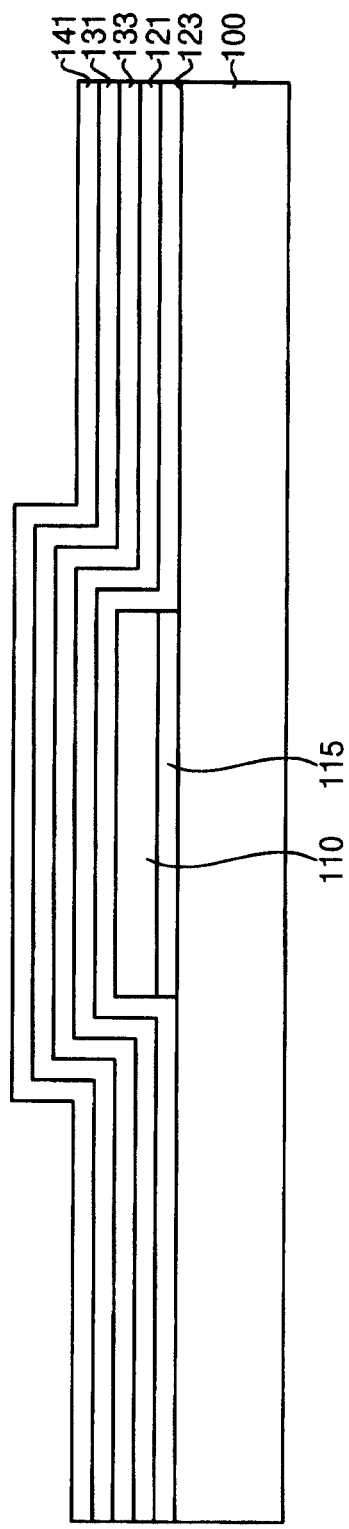

Referring to FIG. 4D, the source/drain metallic layer 141 is deposited on the capping layer 131. The source/drain metallic layer 141 is included in a source electrode and a drain electrode after an etching process. The source/drain electrode metallic layer 141 may include copper, manganese and so on.

Referring to FIG. 4E to FIG. 4H, a conventional photoresist process and a wet etching process is performed using masks after depositing the source/drain metallic layer 141.

Figure 4E:
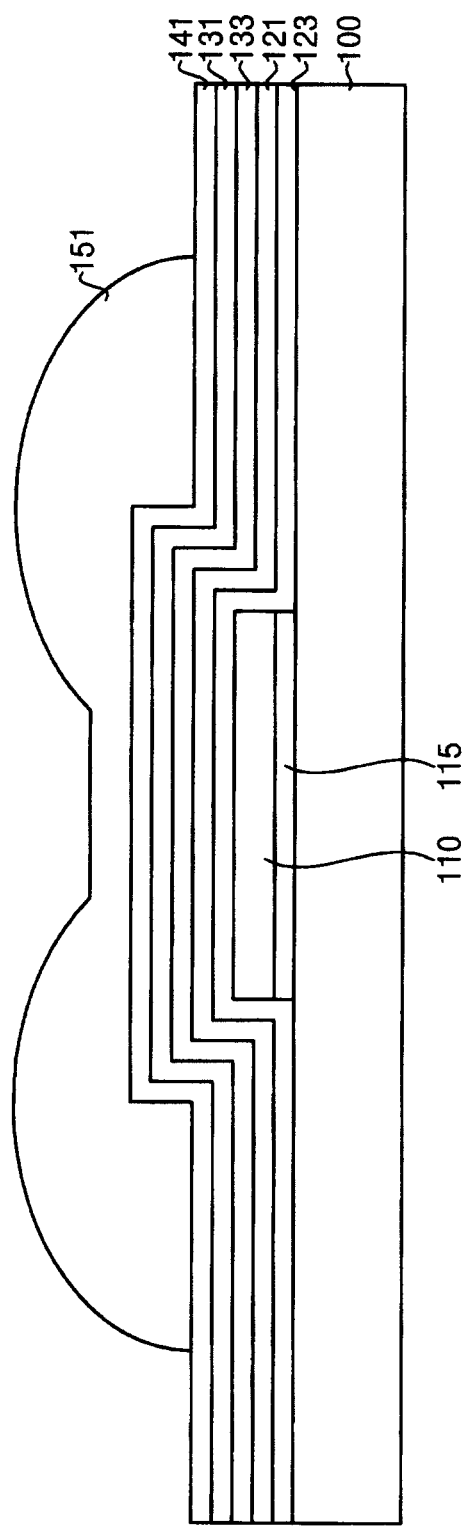

Referring to FIG. 4E, a photo-resist layer 151 is deposited on the source/drain metallic layer 141. The photo-resist layer 151 is deposited in thicknesses and heights according to positions of the source electrode and the drain electrode, and a position of a channel portion of the main active layer 133. The photoresist layer 151 includes a portion 153 corresponding to the channel of the main active layer 133, and the portion 153 is thinner than a remainder of the photoresist layer 153.

Figure 4F:
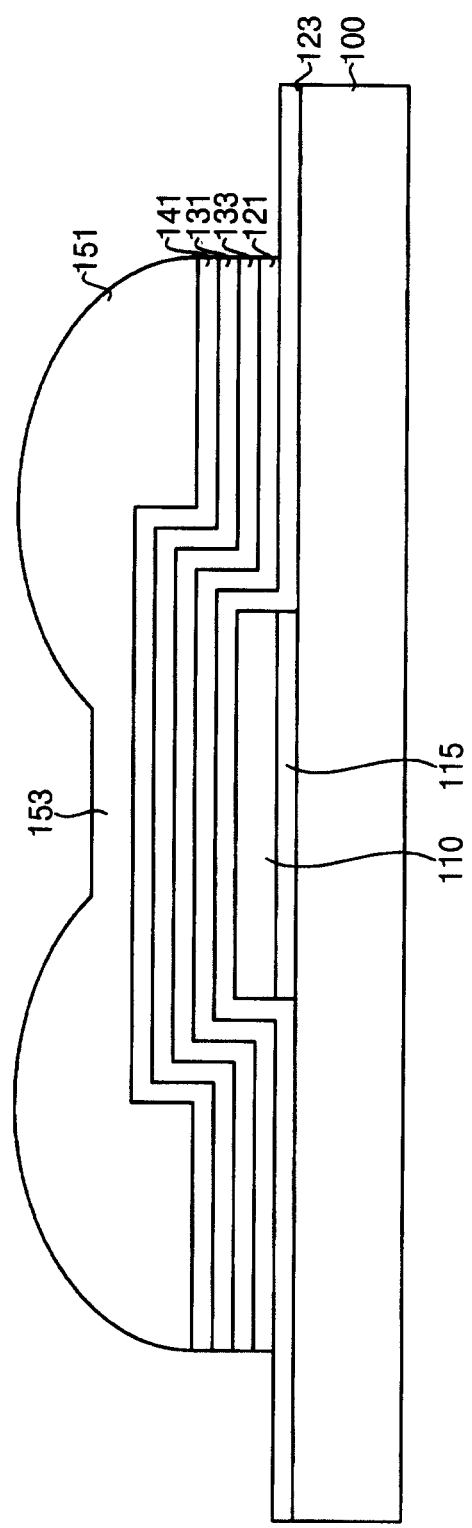

Referring to FIG. 4F, the layered structure including the photo-resist layer 151 is wet-etched. The etchant may include a hydrogen fluoride (HF) solution. Portions of the lower sub active layer 121, the main active layer 133, the capping layer 131 and the source/drain metallic layer 141 are removed in the wet-etching process using the photoresist layer 151.

Figure 4G:
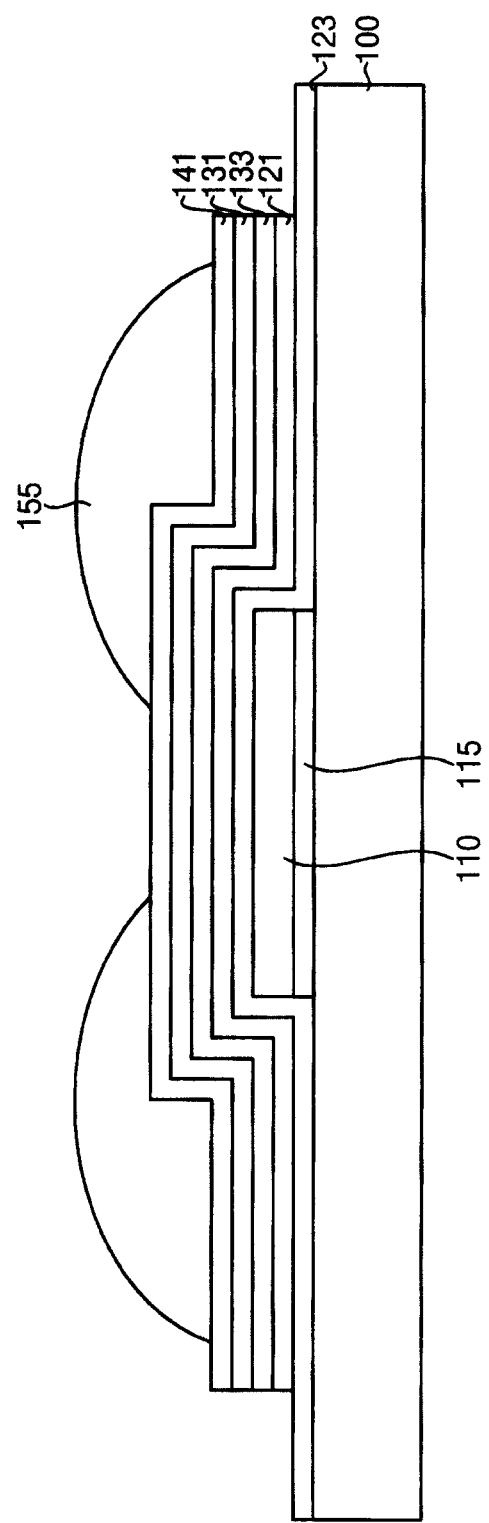

Referring to FIG. 4G, an etch back process is performed in order to form the channel portion on the capping layer 131 and the main active layer 133 by an ashing process. The channel portion is formed by removing portion 153 of the photo-resist layer 151. Photoresist layer portion 155 remain after portion 153 is removed.

Figure 4H:
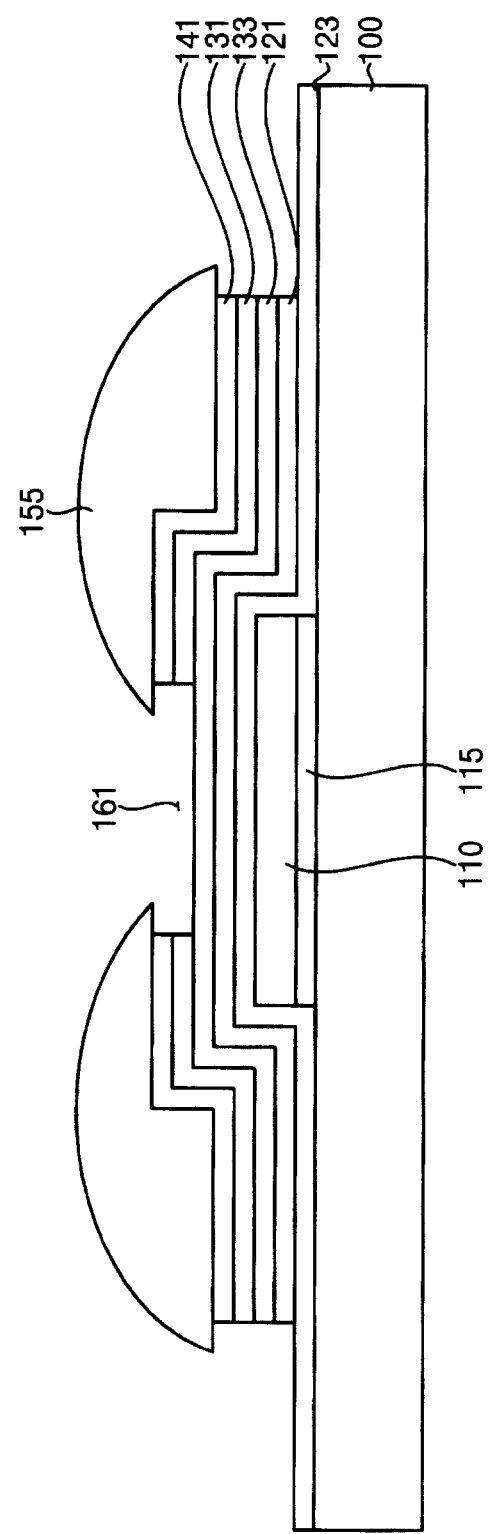

Referring to FIG. 4H, a wet-etching process is performed again in order to form the channel portion. The etchant does not include the HF solution. Only the source/drain metallic layer 141 and the capping layer 131 are etched in the etching process in FIG. 4H, to form channel portion 161. Only the main active layer 133 and the lower sub active layer 121 remain at the channel portion 161.

Thus, the structure of the TFT is substantially formed after the wet-etching process in FIG. 4H. Since the lower sub active layer 121 remains at the channel portion 161, the electron mobility of the channel portion 161 improves without using an annealing process to form the TFT. The lower sub active layer 121 provides electrical current carriers at the channel portion 161 as well as reduces the electrical resistance of the channel portion 161 when the electrical current flows to the TFT. If the lower sub active layer 121 is not formed, the additional annealing process may be performed on the main active layer 133.

Figure 4I:
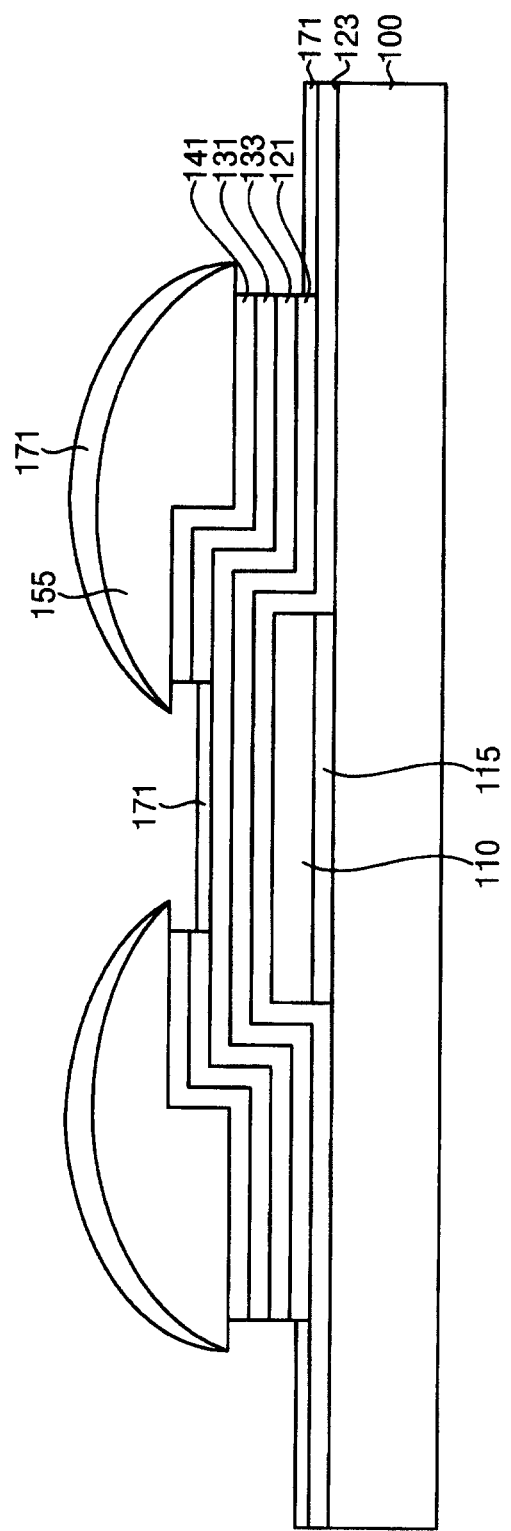

Referring to FIG. 4I, a channel protective layer 171 is deposited on the exposed channel portion 161 of the main active layer 133. The channel protective layer 171 is deposited on the gate insulation layer 123 as well as on the exposed channel portion 161 of the main active layer 133. The channel protective layer 171 protects the exposed portion of the main active layer 133 in the CVD process. When the channel protective layer 171 is not formed, the main active layer 133 is severely damaged during subsequent processing of the TFT and the performance of the TFT is greatly degraded.

Figure 4J:
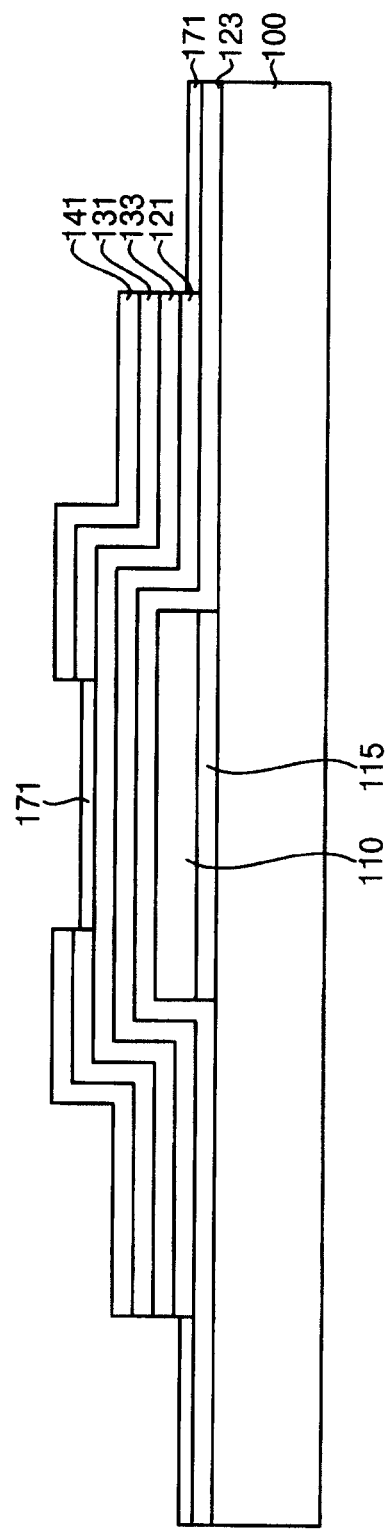

Referring to FIG. 4J, the stripping process is performed by lifting off the remaining photo-resist layer 155 and the channel protective layer 171 disposed thereon. The stripping process may be a conventional process used in the four mask manufacturing process. When the entire remaining photo-resist layer 155 is removed, the TFT structure includes a remaining portion of the channel protective layer 171 on the channel portion 161 of the main active layer 133 and on an upper surface of the gate insulation layer 123.

Figure 4K:
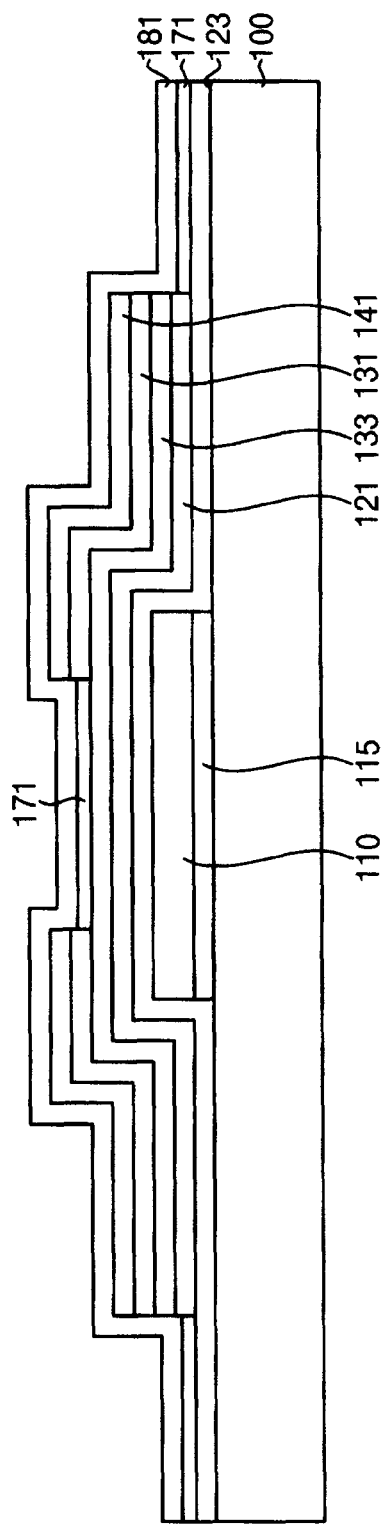

Referring to FIG. 4K, a source/drain insulation layer 181 is deposited on the TFT structure including portions of the channel protective layer 171. The source/drain insulation layer 181 may be formed by the CVD process, and the channel protective layer 171 protects the main active layer 133 in the CVD process. As mentioned the above, without the channel protective layer 171, the main active layer 133 is exposed and damaged in the CVD process, thereby degrading the performance of the TFT.

Figure 4L:
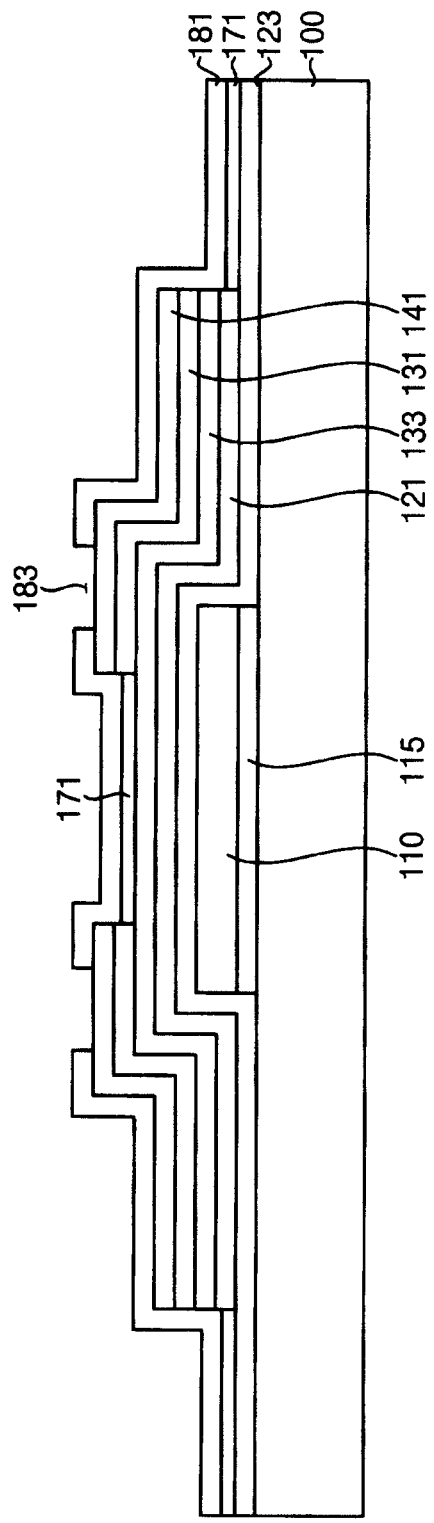
Figure 4M:
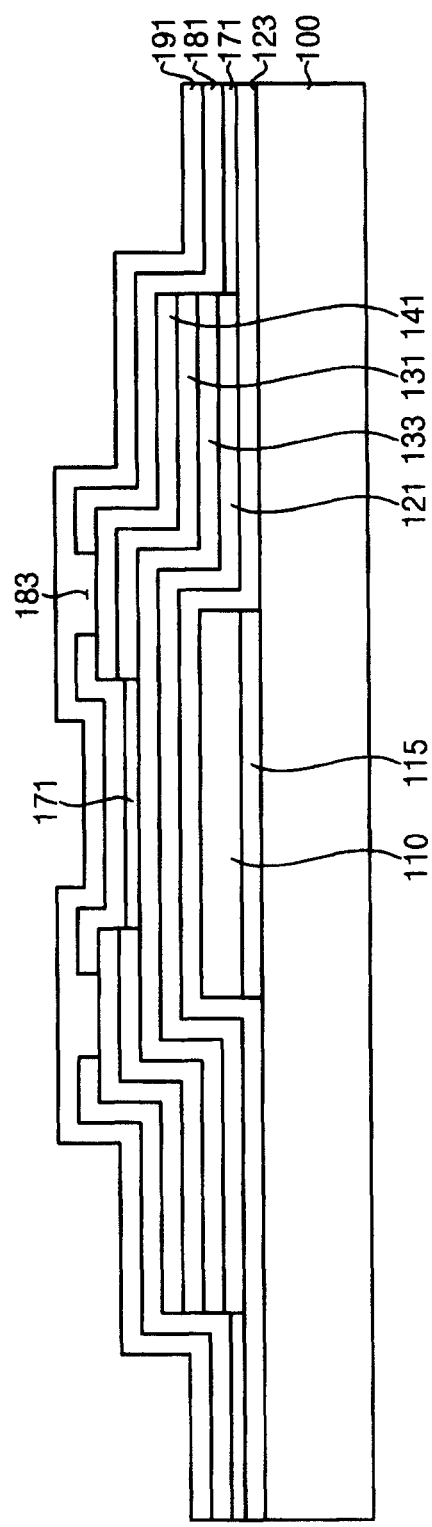

Referring to FIG. 4L to FIG. 4M, a contact hole 183 is formed in the source/drain insulation layer 181 to expose the source/drain metallic layer 141. A pixel electrode layer 191 is deposited on the source/drain insulation layer 181 and on the source/drain metallic layer 141 exposed through the contact hole 183. The pixel electrode 191 layer contacts the source/drain metallic layer 141 through the contact hole 183 in the source/drain insulation layer 181. Thus, the manufacturing the TFT is finished.

FIG. 5A to FIG. 5M are cross-sectional views illustrating another exemplary embodiment of a manufacturing method in accordance with the invention.

A sub active layer of a TFT manufactured by the exemplary embodiment of a manufacturing method includes a lower sub active layer as well as an upper sub active layer. In an alternative exemplary embodiment, the lower sub active layer may not be included. The TFT illustrated in FIG. 5A to FIG. 5M includes the lower sub active layer.

Manufacturing processes illustrated in FIG. 5A to FIG. 5H of the exemplary embodiment of the manufacturing method for a TFT are substantially the same as the manufacturing processes illustrated in FIG. 4A to FIG. 4H. Thus, a repeated description will be omitted. As mentioned the above, the TFT manufactured by the exemplary embodiment of the manufacturing method shown in FIG. 5A to FIG. 5M includes the lower sub active layer. In alternative exemplary embodiments, the lower sub active layer may not be formed.

Figure 5A:
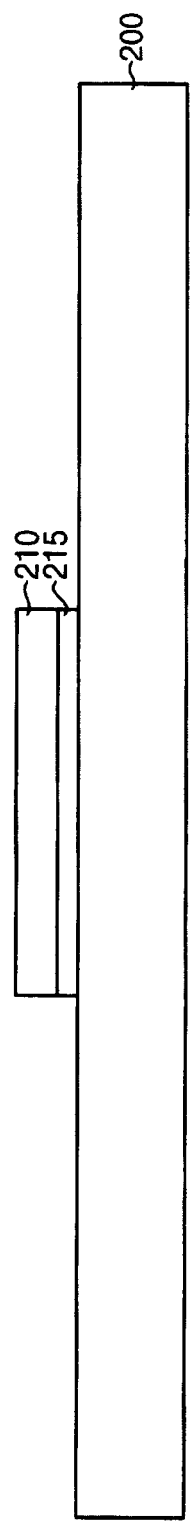

Referring to FIG. 5A, a gate metallic layer 210 is deposited on a substrate 200. An insulation layer 215 may be further formed when required. In order to pattern the gate metallic layer 210, for example, into a gate electrode or a gate wiring, a conventional photo-resist process, a wet etch process and/or a stripping process may be used.

Figure 5B:
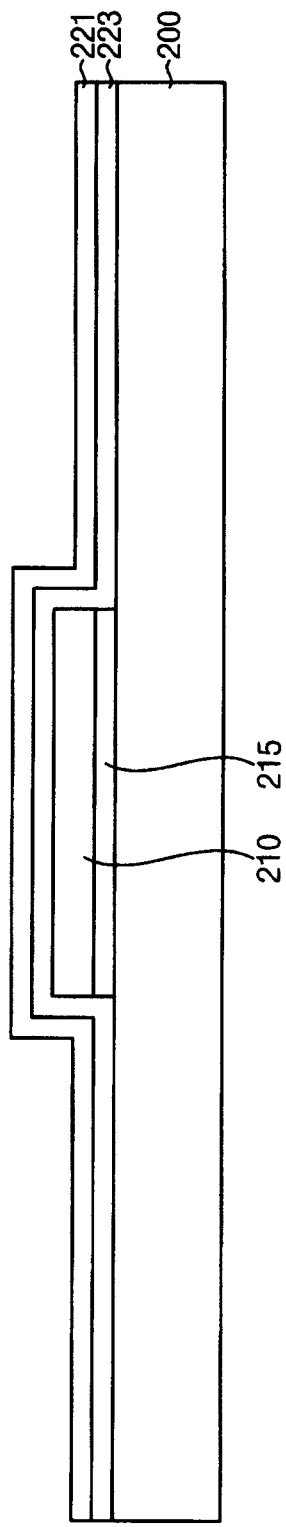

Referring to FIG. 5B, a gate insulation layer 223 is deposited on the gate metallic layer 210 and the exposed substrate 200. The gate insulation layer 223 may include a silicon nitride, or a silicon oxide, for example. A lower sub active layer 221 is deposited on the gate insulation layer 223. The lower sub active layer 221 may be deposited by the sputtering process.

Figure 5C:
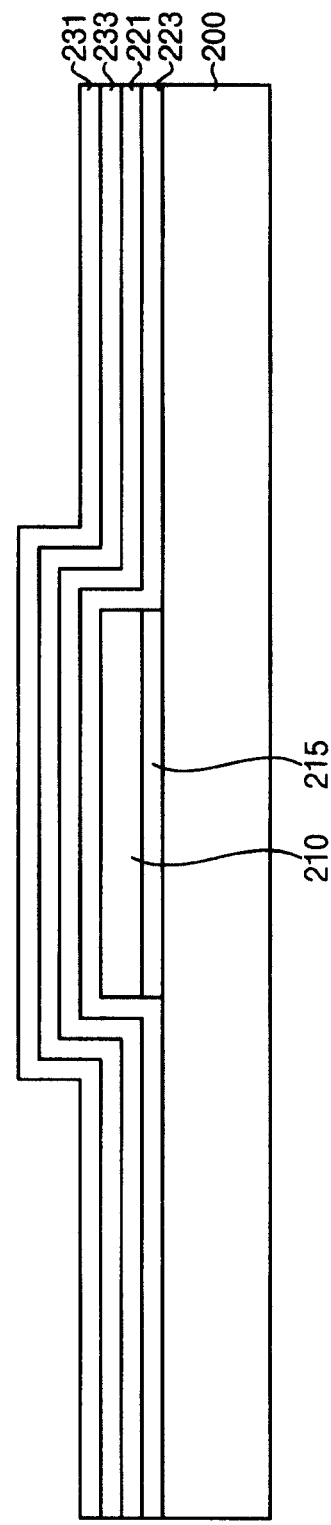

Referring to FIG. 5C, a main active layer 233 is deposited on the lower sub active layer 221. The main active layer 233 includes amorphous silicon. A capping layer 231 may be formed on the main active layer 233. The capping layer 231 is formed before a source/drain metallic layer, may be adhesive and may form a buffer layer for the source/drain metallic layer.

Figure 5D:
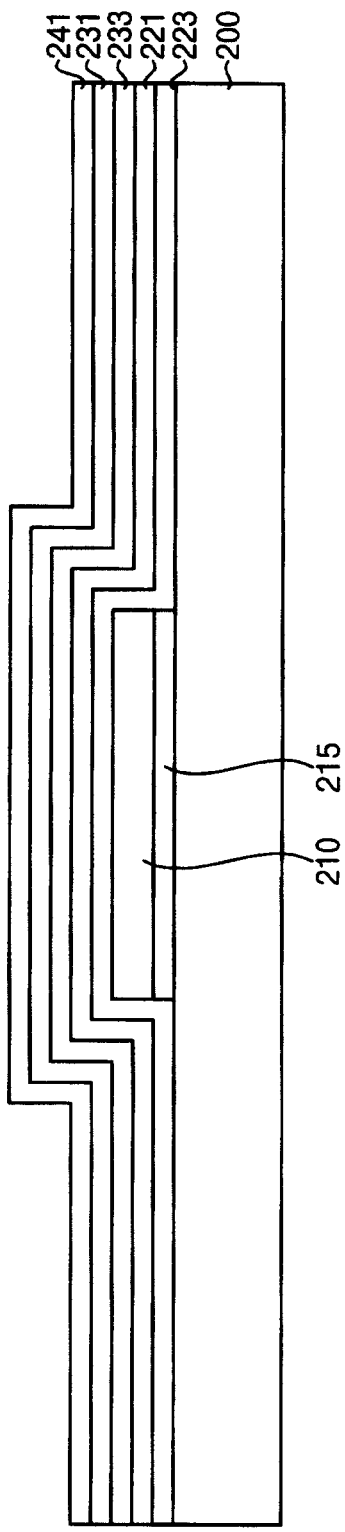

Referring to FIG. 5D, a source/drain metallic layer 241 is deposited on the capping layer 231. The source/drain metallic layer 241 is included in a source electrode and a drain electrode after an etching process. The source/drain electrode metallic layer 241 may include copper, manganese and so on.

Referring to FIG. 5E to FIG. 5H, a conventional photoresist process and a wet etching process is performed using masks after depositing the source/drain metallic layer 241.

Referring to FIG. 5E, a photo-resist layer 251 is deposited on the source/drain metallic layer 241. The photo-resist layer 251 is deposited in thicknesses and heights according to positions of the source electrode and the drain electrode, and a position of a channel portion of the main active layer 233. The photoresist layer 251 includes a portion 253 corresponding to the channel of the main active layer 233, and the portion 253 is thinner than a remainder of the photoresist layer 251.

Figure 5F:
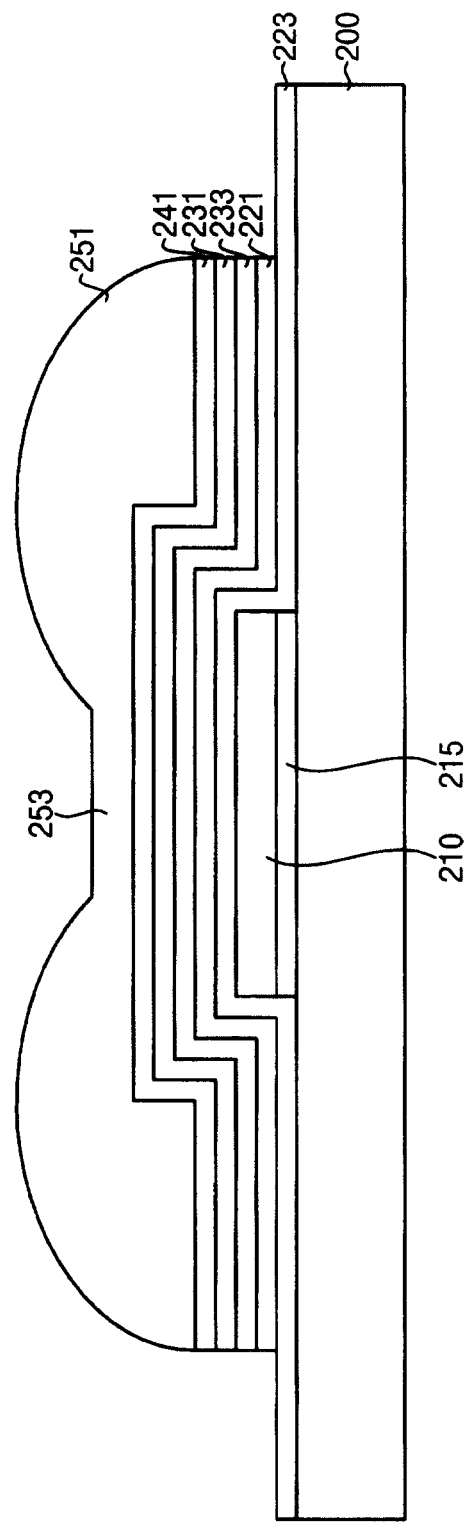

Referring to FIG. 5F, the layered structure including the photo-resist layer 251 is wet-etched. The etchant may include a HF solution. Portions of the lower sub active layer 221, the main active layer 233, the capping layer 231 and the source/drain metallic layer 241 are removed in the wet-etching process using the photoresist layer 251.

Figure 5G:
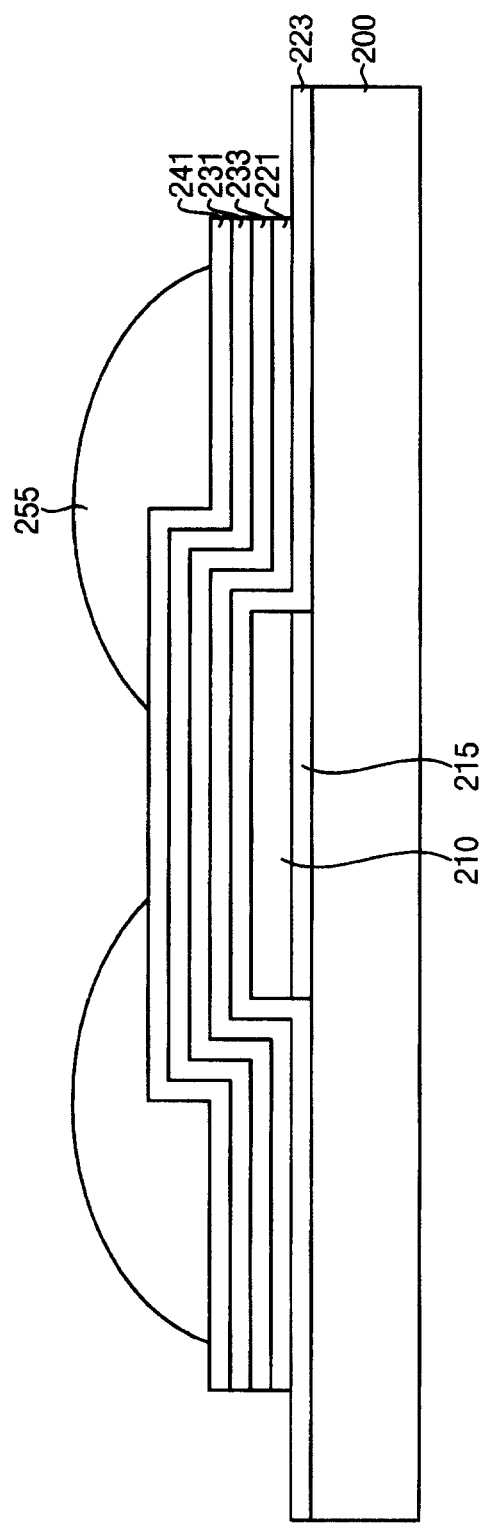

Referring to FIG. 5G, an etch back process is performed in order to form the channel portion on the capping layer 241 and the main active layer 233 by an ashing process. The channel portion is formed by removing portion 253 of the photo-resist layer 251. Photoresist layer portion 255 remain after portion 253 is removed.

Figure 5H:
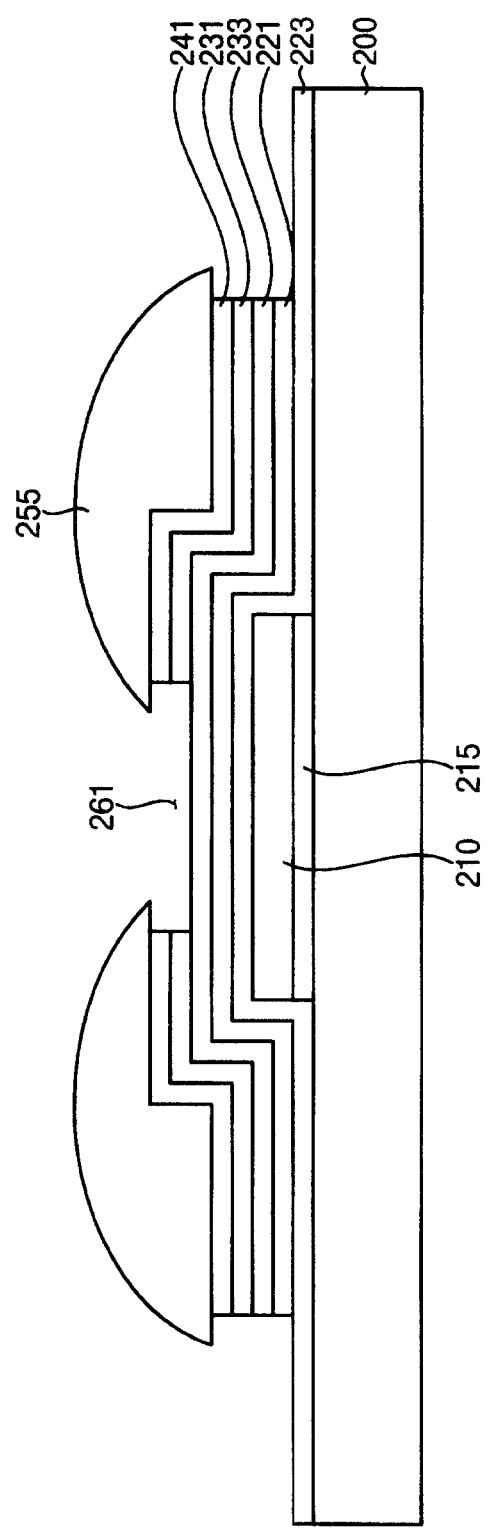
Figure 51:
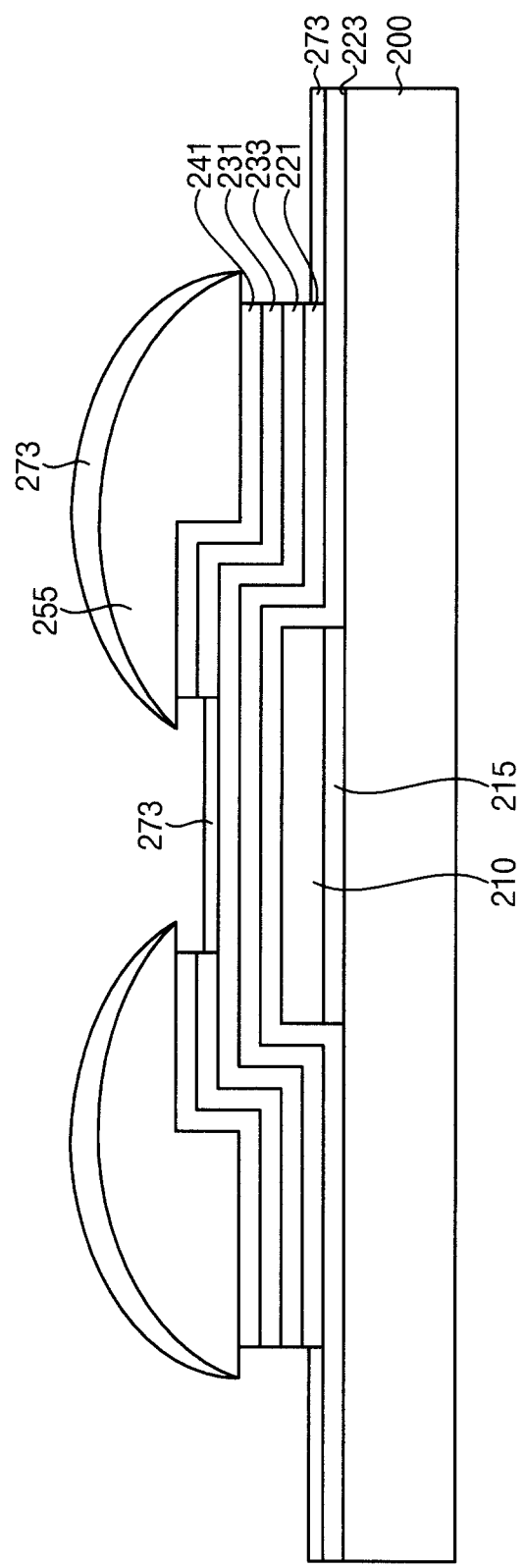

Referring to FIG. 5H, a wet-etching process is performed again in order to form the channel portion. The etchant does not include the HF solution. Only the source/drain metallic layer 241 and the capping layer 231 are etched in the etching process in FIG. 5H. Only the main active layer 233 and the lower sub active layer 221 remain at the channel portion 261. Thus, the structure of the TFT is substantially formed after the wet-etching process in FIG. 5H.

Referring to FIG. 5I, an upper sub active layer 273 is deposited on the exposed channel portion 261 of the main active layer 233. In the previous exemplary embodiment illustrated in FIG. 4I, the channel protective layer 171 is deposited instead of the upper sub active layer 273. The upper sub active layer 273 functions both a protective layer and an active layer. The upper sub active layer 273 may include substantially the same material as the main active layer 233.

An upper surface of the upper sub active layer 273 may be substantially coplanar with an upper surface of the source/drain metallic layer 241. In an alternative exemplary embodiment, an upper surface of the upper sub active layer 273 may not be coplanar with, and be lower than, an upper surface of the source/drain metallic layer 241. In a further alternative exemplary embodiment, an upper surface of the upper sub active layer 273 may be higher than an upper surface of the capping layer 231. In a further alternative exemplary embodiment, an upper surface of the upper sub active layer 273 may be lower than an upper surface of the capping layer 231. When the upper sub active layer 273 has an increased thickness, e.g., a larger height taken from the substrate 200, more electrical current flows through the upper sub active layer 273 since the upper sub active layer 273 provides the electrical path of the electrical current directly from the source electrode to the drain electrode.

The exposed surface of the main active layer 233 at the channel portion 261 is etched after the channel portion is etched. The upper sub active layer 273 helps self-curing of the etched main active layer 233. When the upper sub active layer 273 is formed by the sputtering process, the thickness of the channel portion 261 is increased and the channel portion 261 of the etched main active layer 133 is self-cured.

The following processes are substantially the same with the processes illustrated in FIGS. 4J to 4M except forming the upper sub active layer 273. Thus, a repeated description will be omitted.

Figure 5J:
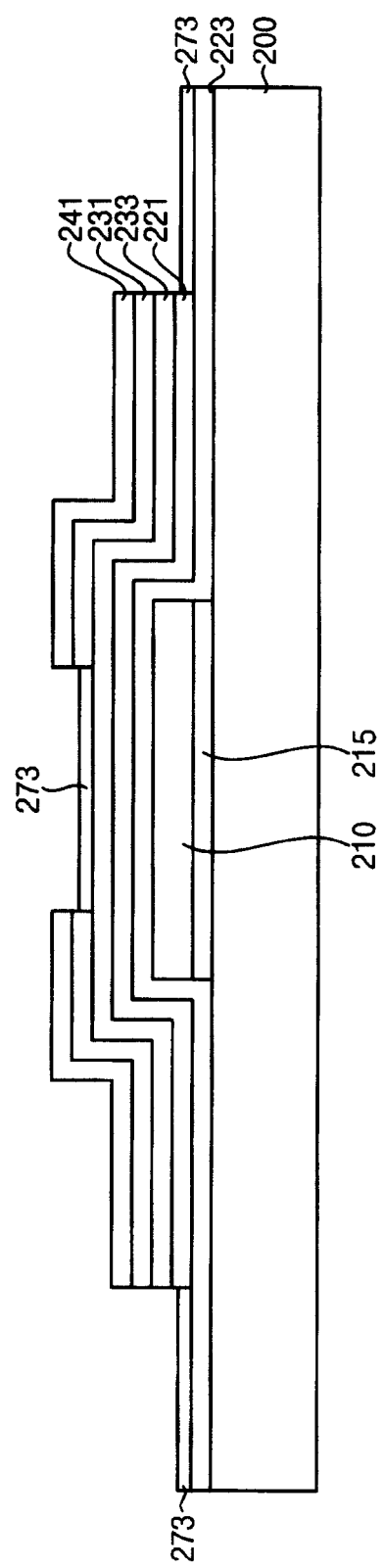

Referring to FIG. 5J, the stripping process is performed by lifting off the remaining photo-resist layer 255. The stripping process may be a conventional process used in the four mask manufacturing process. When the entire remaining photo-resist layer 255 is removed, the TFT structure includes a remaining portion of the upper sub active layer 273 on the channel portion 261 and on an upper surface of the gate insulation layer 223.

Figure 5K:
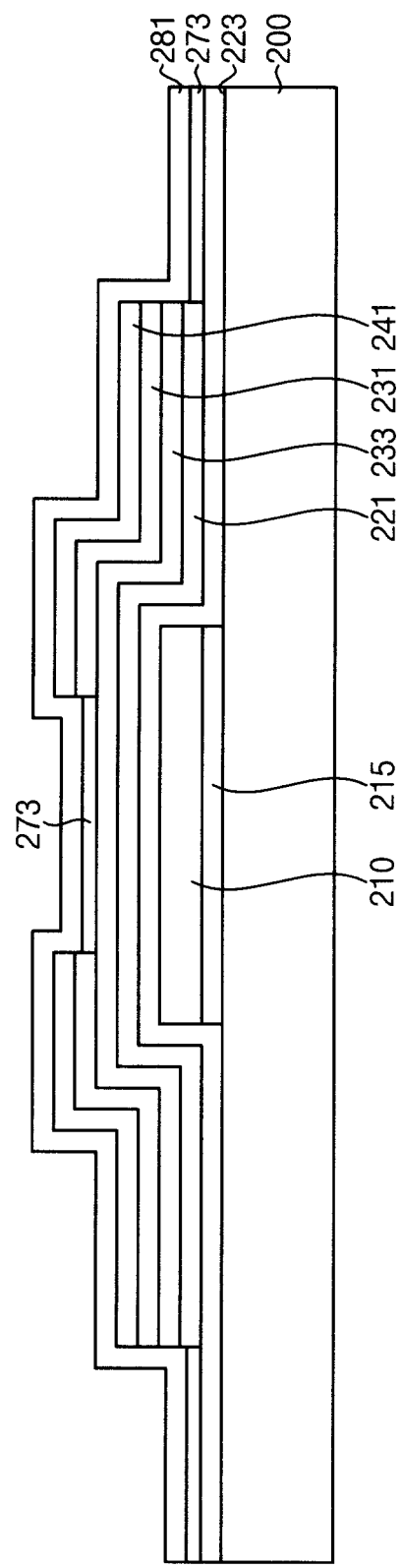

Referring to FIG. 5K, a source/drain insulation layer 281 is deposited on the TFT structure including the remaining upper sub active layer 273. The source/drain insulation layer 281 may be formed by the CVD process. The upper sub active layer 273 protects the main active layer 233 in the CVD process.

Figure 5L:
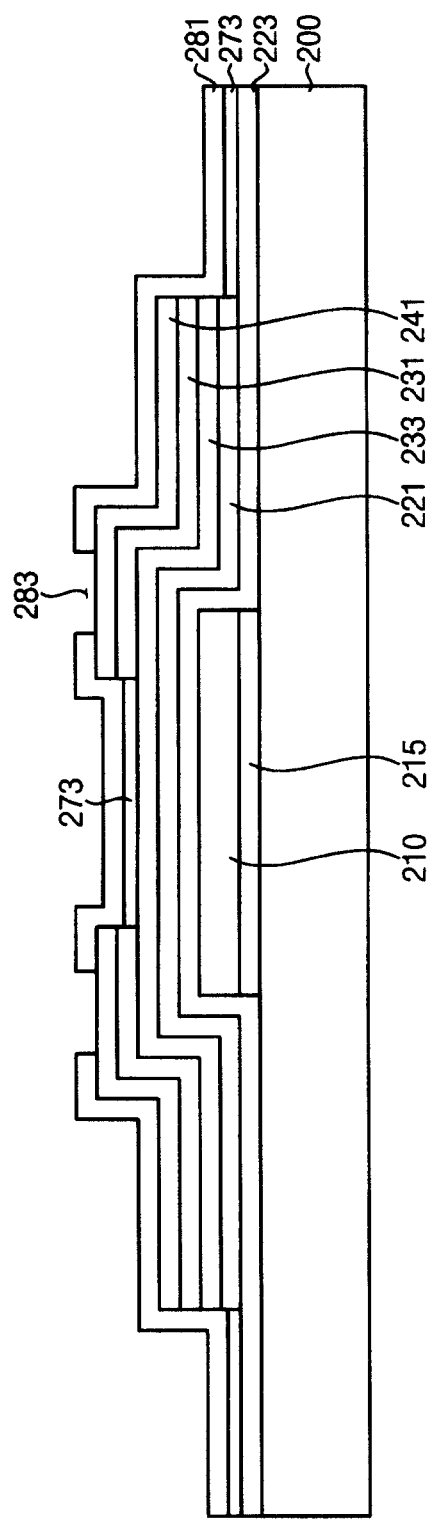
Figure 5M:
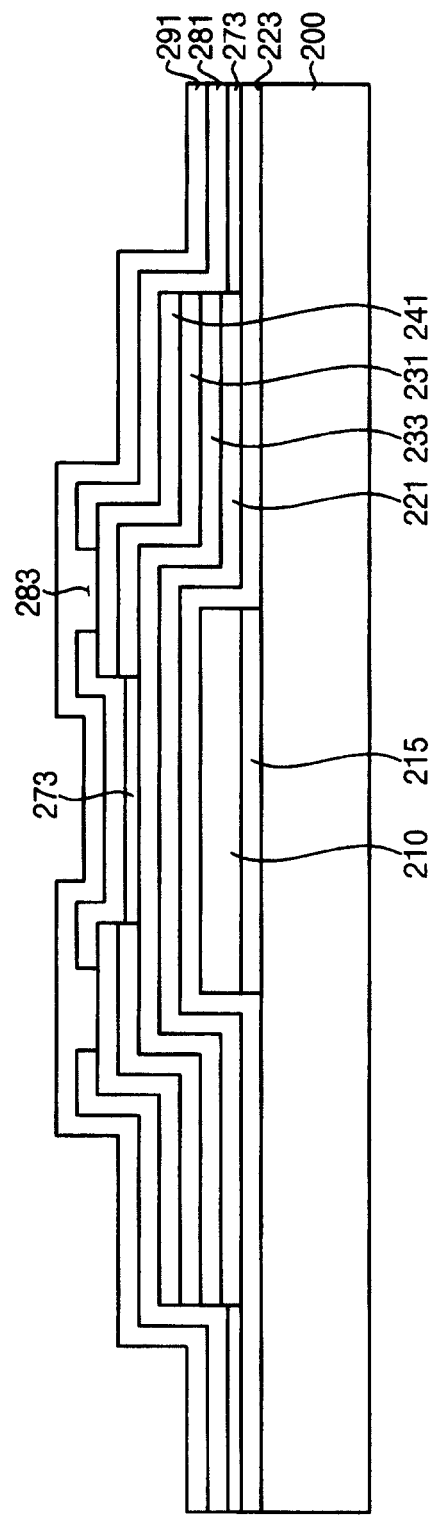

Referring to FIG. 5L to FIG. 5M, a contact hole 283 is formed in the source/drain insulation layer 281 to expose the source/drain metallic layer 241. A pixel electrode layer 291 is deposited on the source/drain insulation layer 281 and on the source-drain metallic layer 241 exposed through the contact hole 283. The pixel electrode layer 291 contacts the source/drain metallic layer 141 through the contact hole 283 in the source/drain insulation layer 281. Thus, the manufacturing the TFT is finished.

As mentioned above, according to one or more of the exemplary embodiments, a sub active layer increases electron mobility for an active layer of a TFT. The sub active layer is formed without an annealing process in the forming of the TFT. Thus, without additional annealing process, the electron mobility is increased in the TFT, and manufacturing time and costs are decreased. Moreover, the sub active layer does not need a further mask process, further decreasing manufacturing time and costs.

In addition, a channel protective layer or an upper sub active layer is formed on the main active layer, and protects the main active layer in a CVD process. Thus, the performance of the finally formed TFT is not degraded.

In addition, the upper sub active layer provides an additional electrical path at a channel portion of the TFT, and helps self-cure the main active layer. Thus, the performance of the finally formed TFT is improved.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A thin film transistor comprising:
   a gate electrode on a substrate;
   a source electrode and a drain electrode which are spaced apart from each other;
   a main active layer which is in electrical connection with the gate electrode, provides electron mobility between the source electrode and the drain electrode, and includes an exposed channel portion;
   and
   a first sub-layer on the main active layer and comprising portions of a same material from which the first sub-layer is formed,
   wherein among the portions of the same material from which the first sub-layer is formed, the first sub-layer comprises:
      an active first portion which is on the exposed channel portion of the main active layer at a first side of the source electrode and a first side of the drain electrode, in electrical connection with the source electrode and the drain electrode and provides a first sub-layer electron mobility between the source electrode and the drain electrode, and
      a second portion exposed by the source electrode and the drain electrode at second sides of the source electrode and the drain electrode respectively opposite to the first sides of the source electrode and the drain electrode,
      wherein the active first portion overlaps with the main active layer and the second portion does not overlap with the main active layer in a plan view of the thin film transistor.

2. The thin film transistor of claim 1, further comprising a second sub-layer between the main active layer and the gate electrode, and comprising portions of a same material from which the second sub-layer is formed, wherein the portions of the same material from which the second sub-layer is formed provide electron mobility between the source electrode and the drain electrode.

3. The thin film transistor of claim 1, further comprising:
   a capping layer between the main active layer and the source electrode, and between the main active layer and the drain electrode.

4. The thin film transistor of claim 1,
   wherein an upper surface of the active first portion of the first sub-layer is substantially coplanar with upper surfaces of the source electrode and the drain electrode.

5. The thin film transistor of claim 1,
   wherein an upper surface of the active first portion of the first sub-layer is lower than upper surfaces of the source electrode and the drain electrode.

6. The thin film transistor of claim 1,
   wherein among the portions of the same material from which the first sub-layer is formed, the active first portion is in a same formed-layer of the thin film transistor as the second portion and is spaced apart from the second portion in the plan view of the thin film transistor.

* * * * *